United States Patent [19]

Brass et al.

[11] Patent Number: 5,049,542
[45] Date of Patent: Sep. 17, 1991

[54] LA123 SUPERCONDUCTOR MATERIALS

[75] Inventors: Stephen G. Brass, Fullerton; Mohammad H. Ghandehari, Brea, both of Calif.

[73] Assignee: Union Oil Company of California, Los Angeles, Calif.

[21] Appl. No.: 374,969

[22] Filed: Jun. 30, 1989

[51] Int. Cl.$^5$ .............................................. H01L 39/12
[52] U.S. Cl. ...................................... 505/1; 505/742; 505/778
[58] Field of Search ...................... 505/742, 1; 264/65, 264/66

[56] References Cited

U.S. PATENT DOCUMENTS 4,804,649  2/1989  Sherif ...................................... 505/1

OTHER PUBLICATIONS

T. Wada et al., "High $T_c$ Superconductor LaBa$_2$Cu$_3$O$_{7-y}$ with Feed Resistance at 92K" Appl. Phys Lett. 52/23), Jun. 6, 1988, pp. 1989–1991.
B. Bender et al., "Processing & Properties of the High $T_c$ Superconducting Oxide Ceramic YBa$_2$Cu$_3$O$_7$" Advanced Ceramics, vol. 2, No. 3B, 1987, pp. 506–511.
T. Wade, N. Suzuki, T. Meada, A. Maeda, S. Uchida, K. Uchinokura and S. Tanaka; "High Transition Temperature superconductor LaBa$_2$Cu$_3$O$_{7-y}$ with Zero Resistance at 92 K", Appl. Phys. Lett. 52(23), Jun. 6, 1988, pp. 1989–1991.
R. L. Meng, P. H. Hor, Y. Q. Wang, Z. J. Juang, Y. Y. Sun, L. Gao, J. Berchtold, J. C. Chu and C. W. Chu, Texas Center of Superconductivity at the University of Houston, Houston, Tex. 77004, "Processing, Chemical Reaction, Instabilities and High Temperature Superconductivity", pp. 233–235.

Primary Examiner—William R. Dixon, Jr.
Assistant Examiner—Chris Gallo
Attorney, Agent, or Firm—Alan H. Thompson; Gregory F. Wirzbicki

[57] ABSTRACT

Orthorhombic perovskitic metal-oxide superconductors of the lanthanum-barium-copper type (LaBa$_2$Cu$_3$O$_y$) wherein Y ranges from 6.8 to 7.0, and T(R=0) is at least about 90° K., can be prepared by sintering and annealing a substantially stoichiometric calcined mixture of one or more sources lanthanum, barium and copper under conditions wherein the time and temperature of exposure to oxygen during the sintering and annealing operations is controlled.

26 Claims, 3 Drawing Sheets

LA123 SUPERCONDUCTOR MATERIALS

BACKGROUND OF THE INVENTION

1. Field of the Invention

The present invention relates to lanthanum metal-oxide superconductors and more particularly to type II, perovskitic superconductors of the $LaBa_2Cu_3O_y$ type, wherein y is between about 6.8 and about 7.0.

2. Background of the Invention

A useful superconductor material must possess a number of electronic and mechanical properties. For example, the superconductor must have zero resistance at a relatively high temperature in a variety of conditions. It must also be able to support a large current density without losing its superconductive state. The higher the temperature at which a superconductor achieves zero resistance, the more desirable it is, provided it can support a high critical current density. Of particular interest at the present time are superconductors which are operative at temperatures above the boiling point of liquid nitrogen ($-196°$ C.).

Superconductors can be divided into two rather different types, type I and type II. In type I superconductors, which include most of the metals exhibiting superconductivity, the coherence length, the maximum distance over which two electrons can maintain the coupling that gives rise to superconductivity, is much greater than the magnetic field-penetration depth. In type II materials, the coherence length is much smaller than the field penetration depth and these materials tend to have much higher superconductivity transition temperatures. Most of the current work to develop practical applications for superconductivity has been with type II materials.

One particularly interesting class of type II superconductor, identified as offering the potential of achieving superconductivity at a temperature above the boiling point of liquid nitrogen, comprises orthorhombic crystalline perovskite metal oxide materials which are admixtures of metals selected from groups IB, IIA and IIIB of the Periodic Table. A representative class of these materials is known as "123" and is of the general formula $R_1Ae_2Cu_3O_y$, wherein R is yttrium or a "lanthanide" metal selected from lanthanum, neodymium, samarium, europium, dysprosium, holmium, ytterbium and lutetium, or mixtures thereof, Ae is an alkaline earth selected from calcium, barium or strontium and y ranges from about 6.0 to about 7.0. Lanthanum is a particularly interesting constituent for these materials because (1) it is by far the most abundant of the lanthanide materials found useful in producing superconductive materials, and (2) the relatively larger size of the crystal lattice, as compared to perovskites prepared with other lanthanide materials, significantly extends the range of lattice parameters available to match these materials with particular substrates in applications requiring epitaxed films of high temperature superconductors.

While a number of synthesis processes have been proposed for forming such superconductor materials, they have not proven to be very successful when lanthanum is used as R, because lanthanum tends to replace at least some of the barium in the crystal lattice, while oxygen in the basal planes of the lattice tends to be poorly ordered insofar as superconductive perovskite type lattice structure is concerned. Consequently, the resultant materials have superconductivity temperatures which are below the boiling point of liquid nitrogen, if superconductivity can be achieved at all.

Over the past few years there has been considerable effort to overcome this problem and considerable improvements have been made in the processes used to make perovskitic $LaBa_2Cu_3O_7$ type materials (hereinafter identified as La123). For example, Maeda (Maeda et al. Jpn. J. Appl. Phys, 26, 1368 (1987)) has reported a process for producing La123 samples having zero resistance at 80° K., said process involving first sintering the material at high temperatures in oxygen and then annealing it at temperatures below about 340° C. More recently, Meng (R. L. Meng et al. "Extended Abstracts High Temperature Superconductors II" pp 233–235 April, 1988, Reno, Nev.) has reported the production of La123 materials with superconductive onset temperatures between about 90° and 100° K and transition widths of 12° K, but the details of the process were not revealed. Wada (Wada et al., Appl. Phys. Lett. 52, 1989 (1988)) has described a process starting with a triple calcining and grinding of the starting material and then sintering this material in an inert atmosphere at temperatures of about 950° C. for 40 hours, followed by slow cooling in a pure oxygen atmosphere, and then annealing in dry oxygen at 300° C. for about 40 more hours to produce materials having zero resistance at about 93° K. Such processes have proven to be expensive, time consuming and/or somewhat erratic in the results achieved.

SUMMARY OF THE INVENTION

The present invention comprises a process for making La123 superconductors and the materials made thereby. The process comprises sintering a substantially stoichiometric mixture of lanthanum, barium and copper oxides under an inert atmosphere to first form a multiphased material having limited substitution of lanthanum for barium, and then for short time under oxygen to convert this multiphase material to a La123 material having a value of Y on the order of about 6 and a tetragonal structure. The oxygen atmosphere is next replaced with an inert atmosphere, such as nitrogen, to prevent adding an excessive amount of oxygen at a temperature above the tetragonal-to-orthorhombic transition temperature. The sintered material is then quenched to a temperature below the tetragonal-to-orthorhombic transition temperature in the inert atmosphere, where it is annealed for a time sufficient for the oxygen atoms in the basal planes of the resultant perovskitic structure to be properly ordered, at which time the material is reexposed to oxygen to increase the value of Y to between about 6.8 and about 7 and form an orthorhombic structure yielding superconductive properties.

The finished materials are typified by having a compositional formula which is close to that for La123 and a superconductivity zero resistance temperature $T(R=0)$ which is higher than about 90° K. Further, the temperature range for the transition temperature width, which is herein defined as the temperature difference between where the resistivity is about 90 percent of the extrapolated normal state resistivity and where the resistivity is about 10 percent of the extrapolated normal state resistivity, is less than about 3° K. and typically ranges between about 1° and about 3° K.

In the present invention, the term "substantially stoichiometric" as applied to the production of La123 materials shall mean that the individual lanthanum, alkaline earth and copper metal constituents are present to within plus or minus 10 weight percent of the stoichiometric amount needed to form a finished product having a nominal composition as indicated by the formula $LaBa_2Cu_3O_{6.8-7}$. Furthermore, the term "lanthanum" as used herein with reference to the compositions of the invention means that while such compositions necessarily contain lanthanum, they may also contain some amount of other rare earth elements which do not negatively affect the superconductive properties observed in the finished product. Because neodymium does not negatively affect the superconductive properties observed with these materials, and, in fact, may even enhance them, the term "lanthanum" therefore includes mixtures or alloys of lanthanum and neodymium wherein the neodymium content thereof will range from 0 to about 99 atom percent. On the other hand, the compositions herein will necessarily contain only small proportions, e.g., less than bout 3.0 weight percent total, preferably being substantially free, of rare earth contaminants which deleteriously affect said superconductive properties, particularly cerium, terbium and praseodymium.

DETAILED DESCRIPTION OF THE INVENTION

In the present invention it has been found that the problems created when lanthanum is used as the basis for forming an orthorhombic perovskitic superconductive material can be avoided by conducting the sintering and annealing operations so that the time and temperature at which the material is exposed to oxygen are carefully controlled.

In the first step, substantially stoichiometric amounts of one or more sources of lanthanum, barium and copper are calcined in air to produce an intimate mixture of oxides. Suitable material sources for this purpose include the metals themselves, their oxides and one or more materials which can be thermally decomposed to form these oxides, such as the hydroxides, carbonates, nitrates, acetates and other metal organic acid salts, other organometallic compounds, intermetallic compounds, polymers, etc., with the oxides and carbonates being preferred. Typical calcining procedures involve merely heating a blend of the mixed salts, in air, at a temperature between about 800° C. to about 1000° C., for between about 10 and about 72 hours, preferably between about 10 and about 20 hours. After cooling, the resultant mixed oxide clinker is ground to a fine powder, preferably to less than about 325 mesh. At this point silver or gold powder, and/or the oxides thereof may be added to the ground clinker in amounts sufficient to improve sinterability. When this is done, it is also found that the resistance of the finished superconductive material to attack by moisture is improved, as are mechanical properties such as flexibility. The amount of silver or gold added will depend upon the particular anticipated application of the finished product and can range up to as much as about 80 weight percent, although between about 1 and about 30 weight percent is more typical and preferred.

This blended clinker powder is then pressed, at pressures ranging from about 10,000 psi to over 500,000 psi, preferably between about 10,000 and about 30,000 psi, into a green compact, such as a small disc or some other arbitrarily chosen shape. This is sintered in a non-reactive atmosphere, for example, a vacuum or, preferably, a stream of an inert gas such as nitrogen, helium or argon, as the first step in the production of the final superconductive product.

The exact time and temperature needed to sinter the materials is a function of the purity of the atmosphere, the exact composition of the powder, the sintering temperature selected, the desired degree of sintering, the homogeneity of the initial powder, and the quantity and form of the product or products being sintered. Depending on the extent to which each of these factors is present, total sintering times usually range between about 10 minutes and about 15 hours, with between about 1 and about 5 hours being preferred, with the temperature ranging between about 850° C. and about 1100° C., with between about 900° C. and about 1000° C. being preferred.

Figure 1:
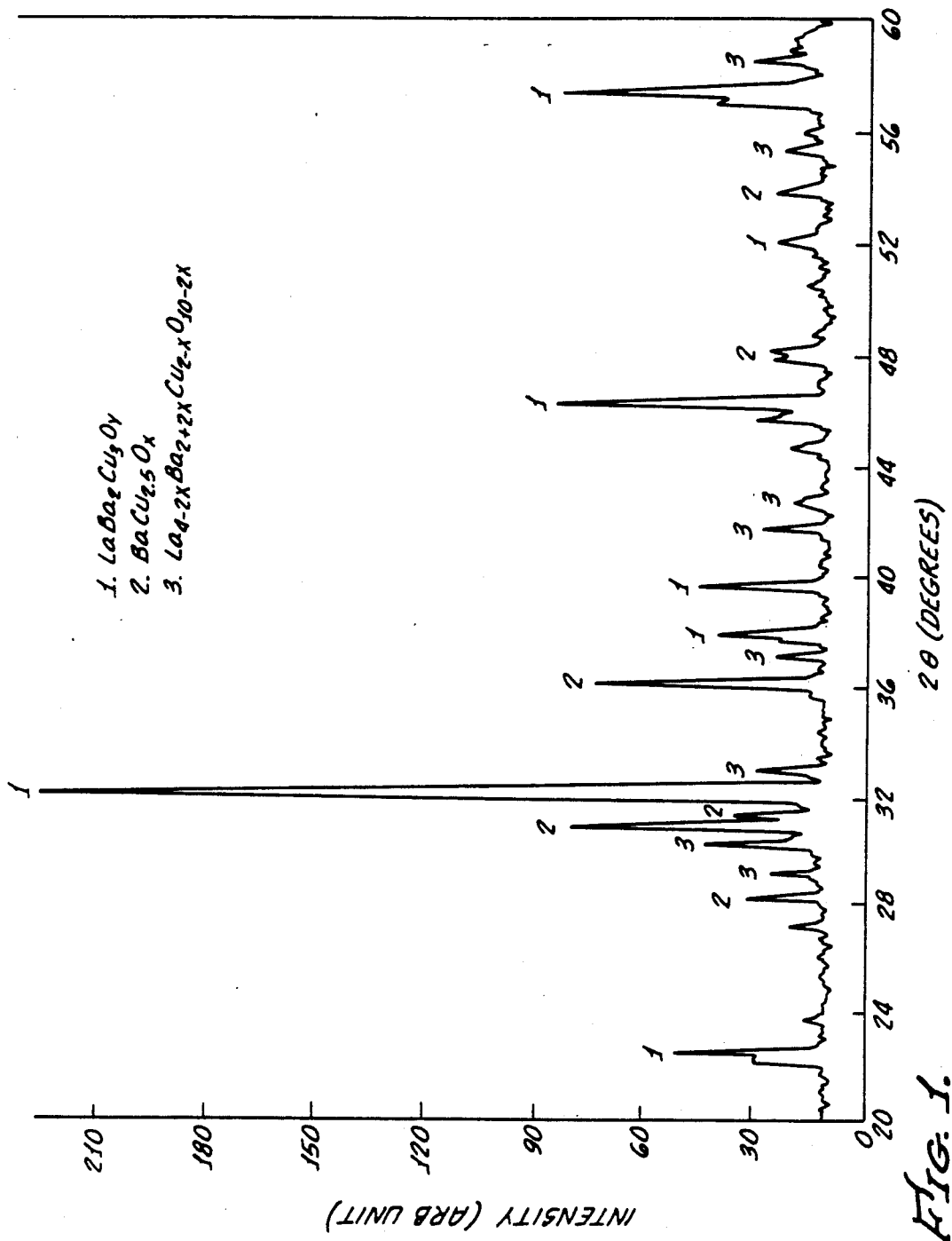
FIG. 1 is an X-ray diffraction pattern showing the multiphase composition of material produced by sintering only in an inert atmosphere.

In practice, the samples are inserted into a furnace which, when necessary, is heated to the final sintering temperature at a rate of about 10°-20° C. minute until the selected temperature is reached. X-ray analysis of the material produced after about 2-3 hours at temperature (and then quenched to stop the reaction) shows it is a polycrystalline material comprised of some amount of tetragonal $LaBa_3Cu_3O_y$, with Y being in the range between about 6.0 and about 6.1, and with substantial amounts of other materials identified as being primarily $BaCu_{2.5}O_{2.0-3.5}$ and $La_{4-2x}Ba_{2+2x}Cu_{2-x}O_{10-2x}$ (wherein X is estimated to be between about 0.1 and about 0.2) also being present (FIG. 1). Such a composition is unsatisfactory for superconductivity applications.

At the completion of the above described sintering operation, the composition is converted to a substantially pure tetragonal crystalline $LaBa_2Cu_3O_y$ material, with Y ranging between about 6 and about 6. , preferably between 6.0 and about 6.1. This is accomplished by first replacing the non-reactive atmosphere with oxygen and continuing the sintering operation at temperature for an additional time of up to about 20 hours, preferably between about 10 minutes and about 10 hours, most preferably between about 30 minutes and 4 hours. It is found that, as a result of this limited time of oxygen exposure, while six oxygen atoms are incorporated into each cell of the tetragonal crystal structure, relatively little randomly ordered oxygen is found in the basal planes thereof.

At the conclusion of this oxygen exposure, the temperature is then slowly lowered, at a rate between about 1/2° and about 5° C./minute, preferably between about 2° C. and about 3° C./minute, to a temperature which is still above the tetragonal-to-orthorhombic transitional temperature, e.g., between about 400° and about 900° C., preferably between about 750° to about 850° C, at which temperature the oxygen is removed and replaced with an inert gas. The material may be further held at this temperature for an additional time of up to about 1 hour to be sure that the gas exchange is completed, at which time the samples are rapidly cooled with cold inert gas to a temperature in the range from the tetragonal to orthorhombic transitional temperature, e.g. about 350° C., to about 280° C, preferably to about 300° C.

To permit the correction of any misordering of the small amount of oxygen in the basal planes of the crystal structure, the material is held in this atmosphere and at this temperature for up to about 24 hours, preferably up to about 4 hours, and more preferably, between about 20 minutes and about 2 hours. It is found that, when the amount of oxygen in the basal planes is controlled as hereinabove described, any correction need to properly order any misordered oxygen atoms is far less difficult than is the case with prior art processes, wherein either the entire sintering operation or the entire annealing operation is conducted under oxygen. At this time, the material is substantially pure $LaBa_2Cu_3O_y$, with Y being between about 6.0 and about 6.2, and is contaminated with, at most, about 0.1 weight percent of $BaCuO_2$.

Figure 2:
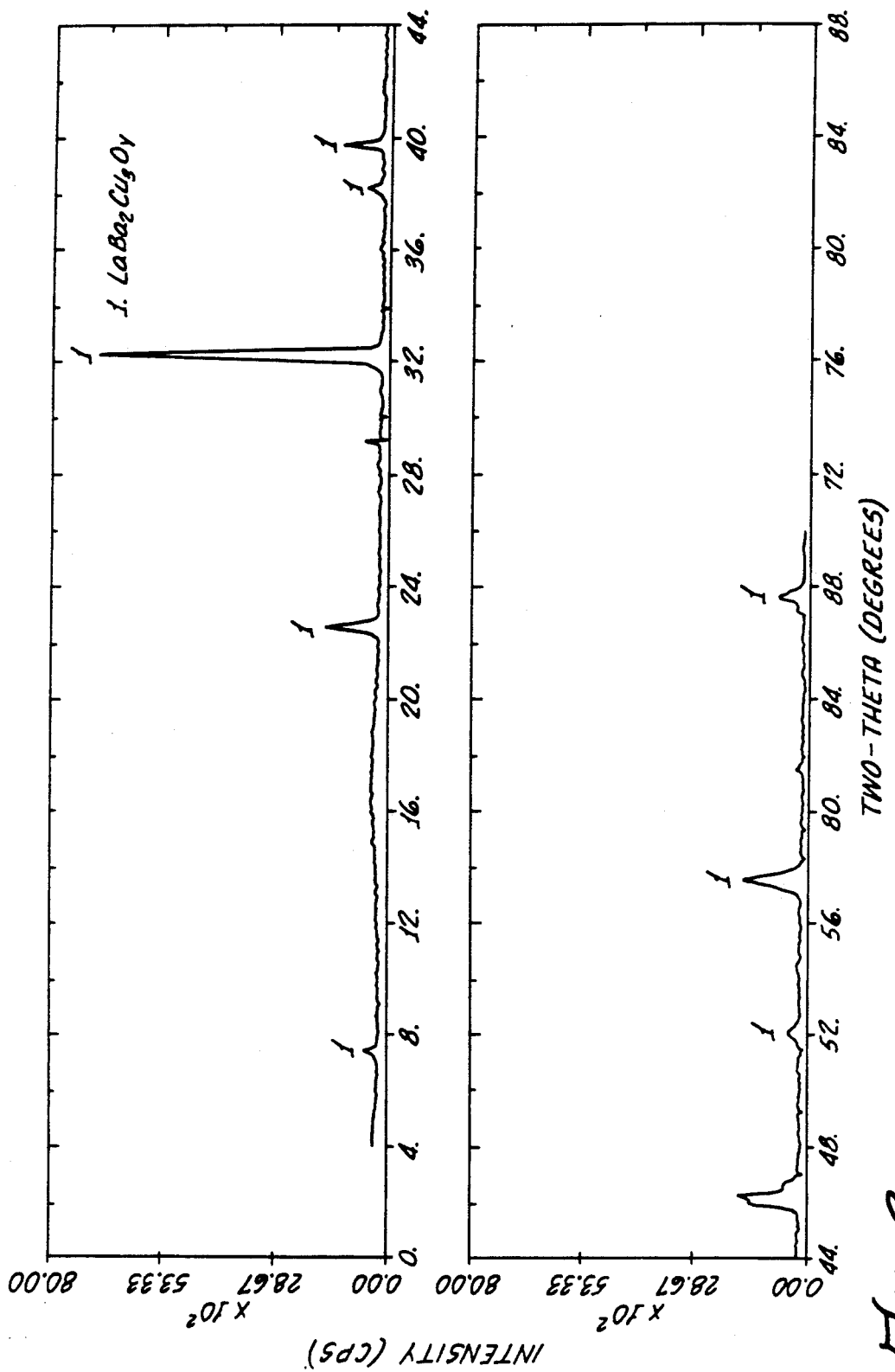
FIG. 2 is an X-ray diffraction pattern showing the composition of the final material produced by the process of the present invention.

The annealing operation is completed when the inert gas atmosphere is replaced by oxygen and the samples held at temperature, i.e. between about 280° K. and about 350° C., for an additional time ranging between about 1 and about 24 hours, preferably between 12 and about 20 hours. This final low temperature anneal has the effect of both raising the total oxygen level, Y, to between about 6.8 and 7.0, and of properly ordering these additional oxygen atoms into the basal planes so as to form an orthorhombic perovskitic crystal structure having superconductive properties (FIG. 2.). At the conclusion of this second oxygen treatment it is found that materials made by the general procedure described above have a density ranging from about 4.5 up to the theoretical density of about 6.2 grams/cc and achieve superconductivity at temperatures above 93.5. K., typically in the temperature range of about 94° to about 98° K.

EXAMPLE

A substantially stoichiometric "La123" mixture comprised of dried lanthanum oxide, barium carbonate, and cupric oxide was mechanically mixed in a rotating ball mill for about 1 hour, after which the mixture was calcined in air at a temperature of about 950° C. for about 16 hours. The resultant material was ground to minus 325 mesh and then pressed into one gram, one half inch diameter pellets at a pressure of about 20,000 psi.

The pellets were then placed inside a tube furnace and, at a rate of about 10° C./minute, brought up to a sintering temperature of about 935° C. under a nitrogen atmosphere, where it was held for about two hours. At the end of this time, the atmosphere in the furnace was changed from nitrogen to oxygen, with the samples being maintained at temperature for an additional 2 hours. At the conclusion of this time, the temperature was dropped, at about 2° C./minute, to about 820° C. where, after about 5 minutes at temperature, the oxygen atmosphere was replaced with nitrogen, with the pellets being held at this temperature for an additional 20 minutes.

Figure 3:
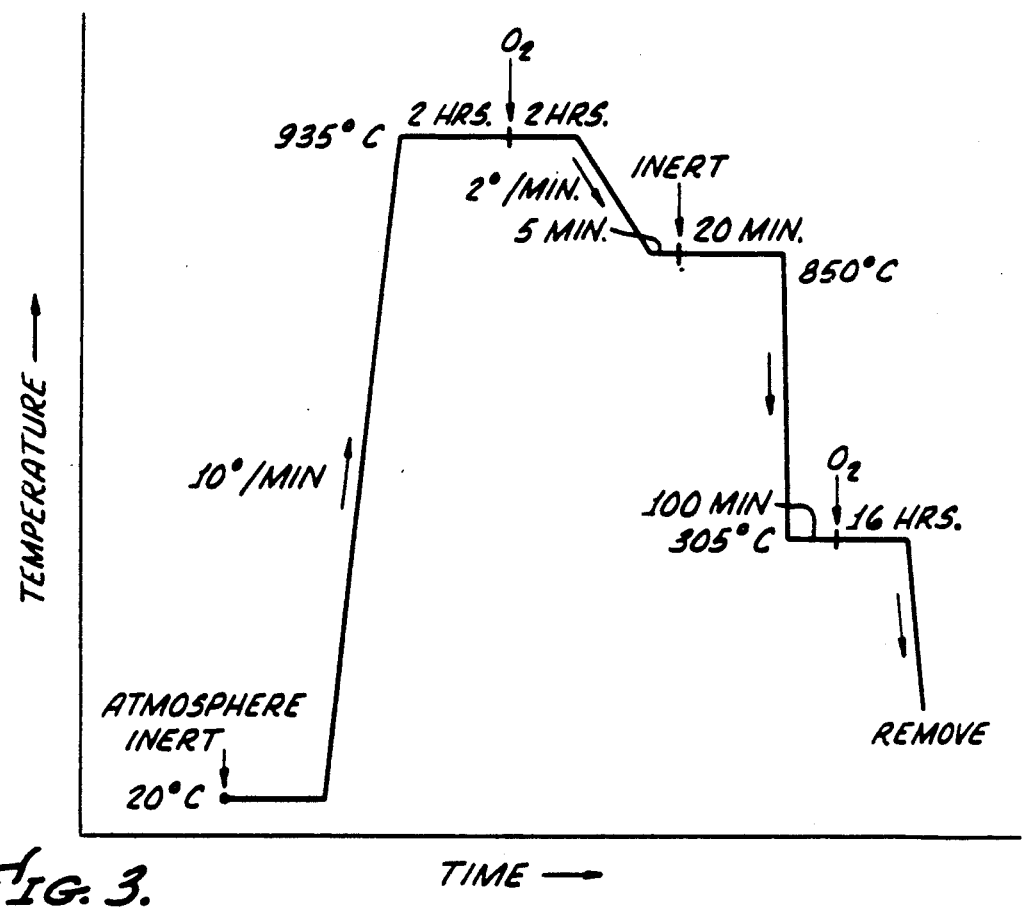
FIG. 3 is a schematic of a typical temperature profile for the process of the present invention as used in the Example.

At the conclusion of this time, the samples were rapidly cooled with cold nitrogen to a temperature of about 305° C., and held at temperature for an additional 100 minutes to allow the oxygen atoms in the basal plane to be properly ordered. The atmosphere was again changed to oxygen, with the pellets being held annealed therein at temperature for an additional 16 hours. This raised the value of Y, the total oxygen content of the orthorhombic La123 crystal structure to between about 6.88 and 7. The temperature at which its resistance equaled 0 at a current density of 15 mA/sq. cm. was 94.2° K. The X-ray diffraction diagram for this material and a schematic of the temperature profile described above are shown as FIGS. 2 and 3. For this material, the transition width is very narrow, i.e., about 2° K.

Obviously, many modifications and variations of this invention, as hereinabove set forth, may be made without departing from the spirit and scope thereof. For example, the material from which the initial calcined clinker is derived need not be derived by blending the relatively pure individual components prior to calcining. Instead, it may be derived from any source, such as by coprecipitated a hydrated oxide or by any other suitable blending operation. Furthermore, the sintered superconductor need not be formed into a free standing item. Rather, the sintered polycrystalline material may be deposited to form either an epitaxial or non-epitaxial film on a semiconductor substrate, such as silicon, or on an insulating substrate, such as aluminum oxide. Alternatively, calcined material may also be deposited onto such a structure and the combined structure taken through the sintering operation to produce the finished product. Therefore, only such limitations should be imposed as are indicated in the following claims. All embodiments which come within the the scope and equivalency of the claims are, therefore, intended to be embraced therein.

We claim:

1. A process for making orthorhombic perovskitic superconductive materials having the nominal formula $LaBa_2Cu_3O_y$, wherein y ranges between about 6.8 and about 7.0, said process comprising the steps of:
    a. sintering a substantially stoichiometric mixture of lanthanum, barium and cupric oxides under a non-reactive atmosphere at a temperature from about 850° C. to about 1100° C.;
    b. changing the sintering atmosphere to comprise oxygen and continuing the time at temperature between least about 10 minutes and about 20 hours, followed by slowly lowering the temperature to between about 400° C and about 825° C.;
    c. changing the sintering atmosphere to an essentially oxygen-free, non-reactive atmosphere and then rapidly lowering the temperature to between about 280° and about 350° C. and annealing the sintered material at this temperature for at least about 1 hour; and
    d. changing the annealing atmosphere to comprise oxygen and continuing the annealing operation at temperature for at at least about 1 hour.

2. A process for making orthorhombic perovskitic superconductive materials having the general formula $LaBa_2Cu_3O_y$, wherein y ranges between about 6.8 and about 7.0, said process comprising the steps of:
    a. sintering a substantially stoichiometric mixture of lanthanum, barium and cupric oxides under under a non-reactive atmosphere at a temperature in the range from about 850° C. to about 1100° C.;
    b. changing the sintering atmosphere to oxygen and continuing the time at the sintering temperature for between about 10 minutes and about 20 hours, followed by slowly lowering the temperature to a value within the range from about 400° C. to about 850° C., which value is about the tetragonal to orthorhombic transition temperature;

c. changing the sintering atmosphere to an inert gas and then rapidly lowering the temperature to one which is between a temperature below the tetragonal to orthorhombic transition temperature and about 280° C. and annealing the sintered material at this temperature for up to at least about 1 hour; and d. changing the annealing atmosphere to oxygen and continuing the annealing operation at this temperature for at least about 1 hour, so as to produce a superconductor having a temperature wherein the $T(R=0)$ is at least about 90° K.

3. The process of claims 1 or 2 wherein, in step a., the non-reactive atmosphere is without pressure.

4. The process of claims 1 or 2 wherein, in step a. said non-reactive atmosphere is a flowing stream consisting essentially of a gas selected from the group consisting of nitrogen, helium and argon.

5. The process of claims 1 or 2 wherein the sintering temperature of step a. is between about 800° C. and about 1000° C. and the sintering time is between about 10 minutes and about 15 hours.

6. The process of claim 5 wherein the sintering temperature of step a. is between about 900° C. and about 1000° C. and the sintering time is between about 1 and about 5 hours.

7. The process of claims 1 or 2 wherein, in step b., the time at the sintering temperature is between about 10 minutes and about 15 hours, following which time the temperature is lowered at a rate of between about 1/2° and about 5° C./minute to a final temperature between about 400° C. and about 850° C.

8. The process of claims 1 or 2 wherein, in step b., the time at the sintering temperature is between about 30 minutes and about 5 hours, following which time the temperature is lowered at a rate of between about 2° and about 3° C./minute to a final temperature between about 750° C. and about 850° C.

9. The process of claims 1 or 2 wherein, in step b., the annealing time is between about 20 minutes and about 4 hours.

10. The process of claims 1 or 2, wherein, in step d., the annealing time is between about 1 and about 24 hours and the resulting superconductor produced in step d. has a $T(R=0)$ of at least about 94° K.

11. The process of claims 1 or 2 further comprising the steps of blending one or more material sources of lanthanum, barium and copper, calcining said blend, in air, at a temperature between about 800° C. and about 1000° C for between about 10 and 72 hours to form a mixed oxide, grinding the resultant cooled clinker to a fine powder and pressing the powder into one or more arbitrarily chosen shapes before said mixture of oxides is sintered.

12. The process of claim 11 wherein said material source is selected from the group consisting of the metals themselves, their oxides and one or more materials which can be thermally decomposed into these oxides.

13. The process claim 11 wherein said material source comprises one or more oxides and carbonates of said metals and said calcining time is between about 10 and about 20 hours and said clinker is ground to a powder size less than about 325 mesh.

14. The process of claim 13 wherein said non-reactive sintering atmosphere is a stream consisting of an inert gas selected from the group consisting of nitrogen, helium and argon.

15. The process of claim 13 wherein the non-reactive sintering atmosphere in step a. consists of nitrogen.

16. The process of claim 14 wherein the sintering temperature of step a. is between about 900° C. and about 1000° C. and the sintering time is between about 1 and about 5 hours.

17. The process of claim 15 wherein the sintering temperature of step a. is between about 900° C. and about 1000° C. and the sintering time is between about 1 and about 5 hours.

18. The process of claim 14 wherein, in step b., the time at temperature is between about 30 minutes and about 4 hours, following which time the temperature is lowered at a rate of between about 2° and about 3° C./minute to a final temperature between about 750° C. and about 850° C.

19. The process of claim 14 wherein, in step c, the annealing time is between about 20 minutes and about 2 hours.

20. The process of claim 14 wherein, in step d., the annealing time is between about 12 and about 20 hours.

21. A process for making orthorhombic perovskitic superconductive materials having the nominal formula $LaBa_2Cu_3O_y$, wherein y ranges between about 6.8 and about 7.0, said process comprising the steps of:

a. calcining, in air, a substantially stoichiometric blend of one or more sources of lanthanum, barium and copper at a temperature between about 800° C. and about 1000° C. for between about 10 and 20 hours to form a mixed oxide;

b. cooling and grinding the resultant mixed oxide clinker to fine powder and pressing the powder into one or more arbitrarily chosen shapes;

c. sintering said pressed powder under an atmosphere comprising a flowing stream of an inert gas selected from the group consisting of nitrogen, helium and argon, at a temperature between 900° C. and about 1000° C. for between about 1 hour and about 5 hours;

d. changing the sintering atmosphere to oxygen and continuing the time at temperature for between about 30 minutes and about 20 hours, followed by slowly lowering the temperature, at a rate of between about 2° C. and about 3° C./minute, to between about 750° C. and about 850° C.;

e. changing the sintering atmosphere to an inert gas and then rapidly lowering the temperature to between about 300° and about 350° C. and annealing the sintered material at this temperature for between about 20 minutes and about 2 hours; and f. changing the annealing atmosphere to oxygen and continuing the annealing operation at temperature for between about 12 and about 20 hours, said superconductor further having a temperature where $T(R=O)$ of at least about 90° K.

22. A superconductive material as made by the process of claim 21.

23. The process of claims 1 or 2 further comprising adding between 0.1 and about 80 percent by weight of one or more additives selected from the group consisting of silver, gold and the oxides thereof to the material before it is sintered.

24. The process of claim 23 wherein said additive is silver or silver oxide and the amount added is between about 5 and about 30 weight percent.

25. The process of claim 21 further comprising adding between 0.1 and to about 80 percent by weight of one or more additives selected from the group consisting of silver, gold and the oxides thereof to the ground oxide material before it is sintered.

26. The process of claim 21 wherein said additive is silver or silver oxide and the amount added is between about 5 and about 30 weight percent.

* * * * *

UNITED STATES PATENT AND TRADEMARK OFFICE
CERTIFICATE OF CORRECTION

PATENT NO. : 5,049,542

DATED : September 17, 1991

INVENTOR(S) : Brass et al.

It is certified that error appears in the above-identified patent and that said Letters Patent is hereby corrected as shown below:

Claim 2, column 6, line 59, delete the second "under"; line 62, after "to" and before "oxygen" insert -- comprise --.

Claim 9, column 7, line 37, delete "b" and insert -- c --.

Signed and Sealed this

Seventeenth Day of August, 1993

*Attest:*

BRUCE LEHMAN

*Attesting Officer*  *Commissioner of Patents and Trademarks*